United States Patent
Jadot et al.

(10) Patent No.: US 12,393,858 B2
(45) Date of Patent: Aug. 19, 2025

(54) ELECTRONIC CIRCUIT FOR DRIVING A QUANTUM CIRCUIT AND ASSOCIATED QUANTUM COMPUTER

(71) Applicant: Commissariat à l'énergie atomique et aux énergies alternatives, Paris (FR)

(72) Inventors: Baptiste Jadot, Gif sur Yvette (FR); Gérard Billiot, Gif sur Yvette (FR); Yvain Thonnart, Gif sur Yvette (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 18/543,454

(22) Filed: Dec. 18, 2023

(65) Prior Publication Data
US 2024/0354623 A1    Oct. 24, 2024

(30) Foreign Application Priority Data

Dec. 21, 2022 (FR) ..................... 22 14144

(51) Int. Cl.
| | |
|---|---|
| G06N 10/40 | (2022.01) |
| G06N 3/065 | (2023.01) |
| G06N 10/00 | (2022.01) |
| G11C 7/10 | (2006.01) |
| G11C 27/02 | (2006.01) |
| H03M 1/82 | (2006.01) |

(52) U.S. Cl.
CPC ............ *G06N 10/40* (2022.01); *G06N 3/065* (2023.01); *G06N 10/00* (2019.01); *G11C 7/10* (2013.01); *G11C 27/024* (2013.01); *H03M 1/82* (2013.01)

(58) Field of Classification Search
CPC ........ G06N 10/40; G06N 3/065; G06N 10/00; H03M 1/82; G11C 7/10; G11C 27/024; H10D 64/27
USPC ............. 326/7; 365/145, 148, 203, 129, 149
See application file for complete search history.

(56) References Cited

U.S. PATENT DOCUMENTS

| | | | |
|---|---|---|---|
| 10,635,990 B1 | 4/2020 | Park et al. | |
| 2024/0281691 A1* | 8/2024 | Zota | ............ H03K 19/195 |
| 2024/0370755 A1* | 11/2024 | Kelly | ............ B82Y 10/00 |

OTHER PUBLICATIONS

French Preliminary Search Report issued Jul. 5, 2023 in French Application 22 14144 filed on Dec. 21, 2022 citing document 24 therein, 2 pages (with English Translation of Categories of Cited Documents).

(Continued)

*Primary Examiner* — Arnold M Kinkead
(74) *Attorney, Agent, or Firm* — Oblon, McClelland, Maier & Neustadt, L.L.P.

(57) ABSTRACT

The circuit is connected to the quantum circuit by bias lines and includes a digital-to-analog converter—DAC delivering an analog voltage; memory cells, connected in parallel at the output of the DAC, each memory cell including a switch and a capacitor, the capacitor storing a level of potential at which to maintain a bias line connected to the output of the memory cell; and a device for generating control signals generating, in synchronization with the DAC, a control signal for each switch of each memory cell, the control signal, a value of the capacitor of a memory cell being selected so as to make negligible a parasitic capacitor affecting the bias line connected to the memory cell and which runs parallel to a neighboring bias line.

10 Claims, 9 Drawing Sheets

(56) References Cited

OTHER PUBLICATIONS

Geck et al., "Control Electronics for Semiconductor Spin Qubits" arxiv.org, Cornell University Library, 201 Olin Library Cornell University Ithaca, NY 14853, 2019, 15 pages.
Extended European Search Report issued May 29, 2024 in European Patent Application No. 23218412.7, citing document 24 therein, 9 pages.
Pellerano S., et al., "Cryogenic CMOS for Qubit Control and Readout", IEEE CICC 2022, 2022, pp. 1-8.

* cited by examiner

ELECTRONIC CIRCUIT FOR DRIVING A QUANTUM CIRCUIT AND ASSOCIATED QUANTUM COMPUTER

BACKGROUND OF THE INVENTION

Field of the Invention

The field of the invention relates to electronic circuits for driving a quantum circuit, placed at the interface between the quantum circuit, at cryogenic temperature, and high-level electronic systems, at ambient or intermediate temperature.

Description of the Related Art

A quantum circuit includes a plurality of qubits, i.e. two-state quantum systems. In a spin qubit quantum circuit, a quantum well traps a single charge so that, according to a particular observable quantity, the charge can be in two possible states. The current state of such observable quantity defines the value (0 or 1) of the qubit. In a spin qubit, the observable quantity is the spin of the charge along a predefined direction.

To establish and configure a quantum well wherein to trap a charge, an electrostatic signal is applied to at least one bias line the distal end of which is placed in immediate proximity to the location of the quantum well.

Thereby, the quantum circuit is provided with a plurality of bias lines.

The document L. GECK et al. "Control Electronics for Semiconductor Spin Qubits", ARXIV.org, CORNELL UNIVERSITY LIBRARY, 201 OLIN LIBRARY CORNELL UNIVERSITY ITHACA, NY 14853, Mar. 12, 2019 (2019-03-12), XP081132552, discloses the structure of an electronic system of a qubit quantum computer. Such electronic system includes a bias generation unit, apt to convert a value stored in a memory unit into a voltage applied to the bias lines, the bias generation unit including a DAC followed by a bias circuit. The latter includes a plurality of memory cells, arranged in parallel at the output of the DAC, each cell comprising a controlled switch and a capacitor storing the bias potential to which the electrode connected to the output of the memory cell is to be brought.

Document U.S. Pat. No. 10,635,990 B1 describes an electronic circuit for driving a quantum circuit. The electronic circuit includes: A Digital-to-Analog Converter (DAC) for generating different levels of static potential; a plurality of memory cells, each memory cell being dedicated to storing a specific level of static potential and supplied at the output of the DAC; and a switching matrix for bringing a particular bias line to a required level of static potential, at a particular instant in the operation of the quantum circuit, by connecting the output of the memory cell storing the required level of static potential, to the bias line in question.

The interest of such electronic circuit of the prior art is to allow the DAC to be placed in the ambient temperature (300 K) or intermediate temperature (4 K) domain and the different memory cells in the cryogenic range (between 10 and 100 mK) with the quantum circuit, so as to reduce the number of links between the two temperature domains.

However, the bias lines of the quantum circuit have a high density, at least in the vicinity of the qubits, so that there is a parasitic capacitive coupling between two neighboring bias lines running in parallel.

Since the lines are too close (typically a hundred nm), the lines cannot be isolated in order to eliminate the parasitic capacitive coupling.

And yet, such coupling would modify the electrostatic potential of a bias line when the electrostatic potential of the adjacent bias line is modified.

Such a modification of the electrostatic potential on a bias line has many negative effects, in particular the effect of altering the conformation of the quantum well, which can disturb the resonance frequency of the qubit, and hence affect the manipulation, the configuration and the reading thereof. In the worst-case scenario, the confinement of the quantum well can be lost and the charge can be lost (or a second charge can be brought into the well).

And yet, the electronic control circuit of the prior art does not make it possible to address the problems of a parasitic capacitive coupling between neighboring bias lines.

It should be noted that for a quantum circuit consisting of a two-dimensional matrix of qubits, there is a parasitic capacitive coupling between a bias line running "horizontally" and a bias line running "vertically" at the point where the lines intersect. However, the corresponding parasitic capacitive coupling is then several orders of magnitude less than the parasitic capacitive coupling that exists between two adjacent "horizontal" bias lines or two "vertical" bias lines.

Similarly, there is a parasitic capacitive coupling between two parallel bias lines, but which are not immediately neighboring each other, another bias line being interposed between the two lines. Not only the distance between the two lines considered, but especially the screening due to the interposed line, lead to the corresponding parasitic capacitive coupling being at least one order of magnitude less (typically 30 times less) than the parasitic capacitive coupling which exists between two neighboring parallel bias lines.

Therefore, the purpose of the invention is to propose an electronic circuit for driving a qubit quantum circuit which would limit the effects of the disturbing capacitive couplings between the neighboring bias lines running in parallel, while maintaining a limited number of connections between the different temperature ranges.

BRIEF SUMMARY OF THE INVENTION

For this purpose, the invention relates to an electronic circuit for driving a quantum circuit and a quantum computer according to the enclosed claims.

BRIEF DESCRIPTION OF THE SEVERAL VIEW OF THE DRAWINGS

The invention and the advantages of the invention will better understood upon reading the following detailed description of the plurality of particular embodiments of the invention, given only as an illustrative example and not limited to, the description being made with reference to the enclosed drawings, wherein.

DETAILED DESCRIPTION OF THE INVENTION

Figure 1:
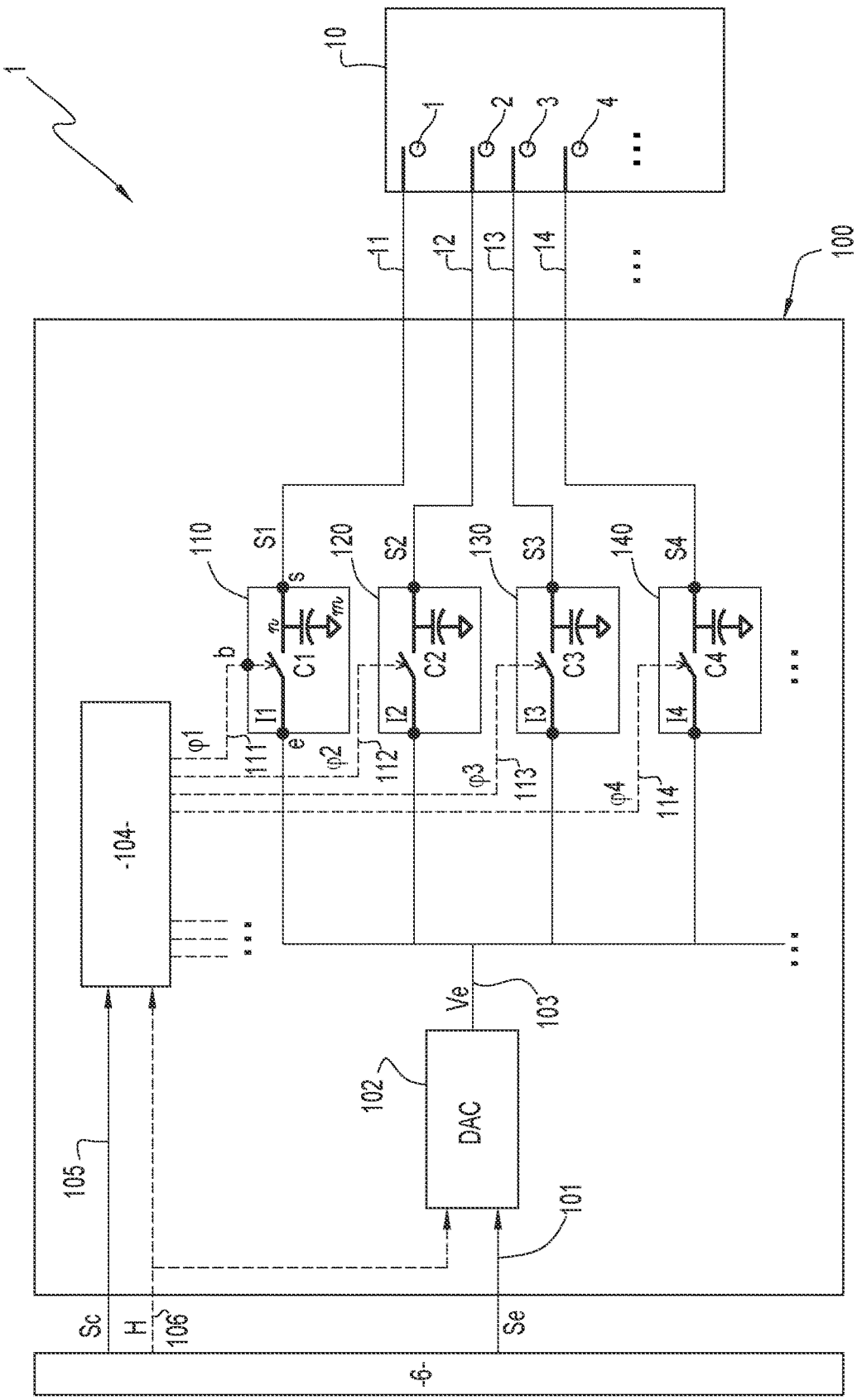
FIG. 1 is a schematic representation of a first embodiment of an electronic interface circuit for a quantum circuit.

FIG. 1 schematically represents an electronic circuit 100 according to a first embodiment of the invention.

The electronic circuit 100 is used for driving a quantum circuit 10. The electronic circuit 100 is placed at the interface between a high-level electronic system 6 and the quantum circuit 10. The high-level electronic system 6, the circuit 100 and the quantum circuit 10 belong e.g. to a quantum computer 1. The latter includes many other components which are not shown in FIG. 1.

The quantum circuit 10 is a qubit device, in particular a spin qubit device. For example, same includes a plurality of 1024 qubits arranged in a column (one-dimensional matrix—1D). In FIG. 1, only the first four qubits 1, 2, 3 and 4 have been schematically shown for illustrative purposes.

The electronic circuit 100 is connected to a plurality of bias lines of the quantum circuit 10. In FIG. 1, only four bias lines 11, 12, 13 and 14 are shown.

In the embodiment shown in the figures, each bias line is associated with a qubit of the quantum circuit 10. More precisely, the proximal end of a bias line is connected to the electronic circuit 100, while the distal end of said bias line is located close to the associated qubit. The biasing of the bias line at a given static potential makes possible the conformation of the quantum well of the associated qubit.

In practice, each bias line can be associated not with a single qubit, but with a plurality of qubits, e.g. a row of qubits in a two-dimensional—2D matrix arrangement of the qubits. Similarly, in both a 1D and 2D matrix arrangement, there can be a plurality of bias lines for one qubit, or one bias line for a plurality of qubits (e.g. between two neighboring qubits in order to delimit the "edge" of two adjacent quantum wells).

The bias lines circulate in parallel with each other. Given the proximity of two neighboring qubits, the distance between two neighboring bias lines is small, so that a parasitic capacitive coupling is established between the two neighboring lines. The distance between two qubits is typically 100 nm, and the spacing between two neighboring bias lines can be less than 50 nm.

The circuit 100 includes a digital-to-analog converter-DAC 102, a control signal generation unit 104 and a plurality of analog memory cells.

The number of cells is equal to the number of bias lines. In FIG. 1, only the first four analog memory cells are shown. The cells are referenced by 110, 120, 130, 140, respectively.

In the present embodiment, the different cells of the plurality of analog memory cells have an identical structure.

The structure will now be presented in detail for the first cell 110.

The cell 110 includes an input e and an output s, and a control terminal b.

The cell 110 include, between the input e thereof and an intermediate node n, a controlled switch I1. The switch I1 is controlled for the opening or the closing by a binary control signal φ1, applied at the output of the unit 104 to a link 111 connecting the terminal b of the cell 110.

The cell 110 further includes, between the intermediate node n and a reference node m (brought to a reference potential such like the ground potential of the circuit 100), a capacitor C1.

The output s of the cell is connected directly to the intermediate node n.

Similarly, the second cell 120 is provided with a switch I2 (the on or off state of which is controlled by a signal φ2 applied at the output of the unit 104 to a link 112 connecting the control terminal of the second cell) and a capacitor C2, the third cell 130 is provided with a switch I3 (the state of which is controlled by a signal φ3 applied at the output of the unit 104 to a link 113 connecting the control terminal of the third cell) and a capacitor C3, and the fourth cell 140 is provided with a switch I4 (the state of which is controlled by a signal φ4 applied at the output of the unit 104 to a link 114 connecting the control terminal of the fourth cell) and a capacitor C4.

The input of the different memory cells is connected at the output of the DAC 102 by a line 103. Thus, the different memory cells are placed in parallel with one another at the output of the DAC 102. The analog voltage Ve, delivered by the DAC 102, is applied simultaneously to the inputs of the cells of the plurality of memory cells, in particular of the cells 110, 120, 130 and 140.

The output of a memory cell is connected directly to the proximal end of only one bias line of the quantum circuit 10. Thereby, the output of the first cell 110 is connected to the bias line 11, the output of the second cell 120 is connected to the bias line 12, the output of the third cell 130 is connected to the third bias line 13, and the fourth cell 140 is connected to the bias line 14.

Each memory cell delivers a bias signal for the associated bias line. Such bias signal is a level of static potential (evaluated with respect to the reference potential). Thereby, the first cell 110 delivers a bias signal S1, the second cell 120 delivers a bias signal S2, the third cell 130 delivers a bias signal S3, and the fourth cell 140 delivers a bias signal S4.

The DAC 102 generates the analog voltage Ve from a digital control signal Se coming from the high-level electronic system 6. The signal Se is applied to the input connection 101 of the circuit 100.

The control signal generation unit 104 generates the different control signals of the different memory cells from an addressing signal Sc coming from the high-level electronic system 6. The signal Sc is applied to the input link 105 of the circuit 100.

To synchronize the DAC 102 and the unit 104 (i.e. the generation of the control signals of the memory cells and the analog voltage Ve applied to the input of the memory cells), the two components share a common clock signal H. The signal is e.g. delivered by the high-level electronic system 6 on the input link 106 of the circuit 100.

Thereby, according to the invention, a bias line is connected directly at the output of a memory cell. There are thus as many memory cells as there are bias lines for controlling the quantum circuit 10.

The set of switches of the memory cells, in association with the unit 104, can be seen as a demultiplexer used for applying the current value of the analog voltage Ve generated at the output of the DAC 102, to the bias line to be biased to the level of static potential corresponding to the current value of the analog voltage.

More precisely, the switch I1 of the cell 110 is first closed. The input voltage Ve then makes it possible to charge the capacitor C1 so that the intermediate node n (and hence the line 11) is taken to the level of static potential corresponding to the current value of the analog voltage Ve. The capacitor C1 "memorizes" the level of static potential. In the closed state of the switch I1, the impedance of the line 11 is low.

The switch I1 is then opened. In the open state of the switch I1, the capacitor C1 maintains the intermediate node n (and hence the line 11) at the stored level of potential. In the open state of the switch I1, the impedance of the line 11 is high.

Since a bias line, such as line 11, is an open conductor (no load is connected to the distal end of the bias line on the side of the quantum circuit), there is no consumption of electricity along a bias line. In addition, any leakage of electrical charges is extremely low since the memory cells and the bias lines are located in the cryogenic range. Since the dielectric of the capacitor C1 or the dielectric between the bias lines 11-14 are good insulators, the leaks mainly come from the finite resistive state of the switch I1 (in the open state). Since the switch I1 consists of a transistor, the leakage current thereof decreases with temperature.

As a result, a bias line is brought and then maintained at the level of static potential stored by the associated cell.

The capacitor of each memory cell is chosen so as to be sufficiently large with respect to the parasitic capacitor between the bias line coming from the memory cell in question and a neighboring bias line. As a result, it is possible to dispense with the negative effects of the parasitic capacitive coupling between neighboring bias lines running parallel to each other.

Knowing that the parasitic capacitor is typically a few femtofarad (fF), the value of the static capacitor, C1, is chosen between 10 and 1000 fF, preferentially between 50 and 200 fF, more preferentially equal to 100 fF, for bias lines extending over a length of 20 μm.

In practice, a bias line consists of a proximal section and a distal section. The proximal section is used for routing the bias line for the connection thereof to the electronic circuit, whereas the distal section converges to the location where the quantum well(s) is/are to be configured. The parasitic capacitor affecting a bias line is then created at the distal section thereof by coupling with the distal section of a neighboring bias line. On the other hand, the distance separating two proximal sections of neighboring lines is greater. In this way it is advantageously possible to insert a ground line between two proximal sections of neighboring lines. As a result, the proximal section of a bias line has a routing capacitor. To attenuate the effects of the parasitic capacitor, it is then necessary to take the routing capacitor into account when dimensioning the static capacitor of the memory cell.

A static capacitor is then sought such that the ratio between the parasitic capacitor and the total capacitor (static capacitor increased by the routing capacitor) is less than 1%.

It should be noted that the final value of the static capacitor is adjusted so as to achieve a compromise between the rise time of the potential on the bias line (when the switch of the cell is closed and the static capacitor has be charged for storing a new level of potential) and the attenuation of the capacitive coupling with the neighboring lines.

Figure 2:
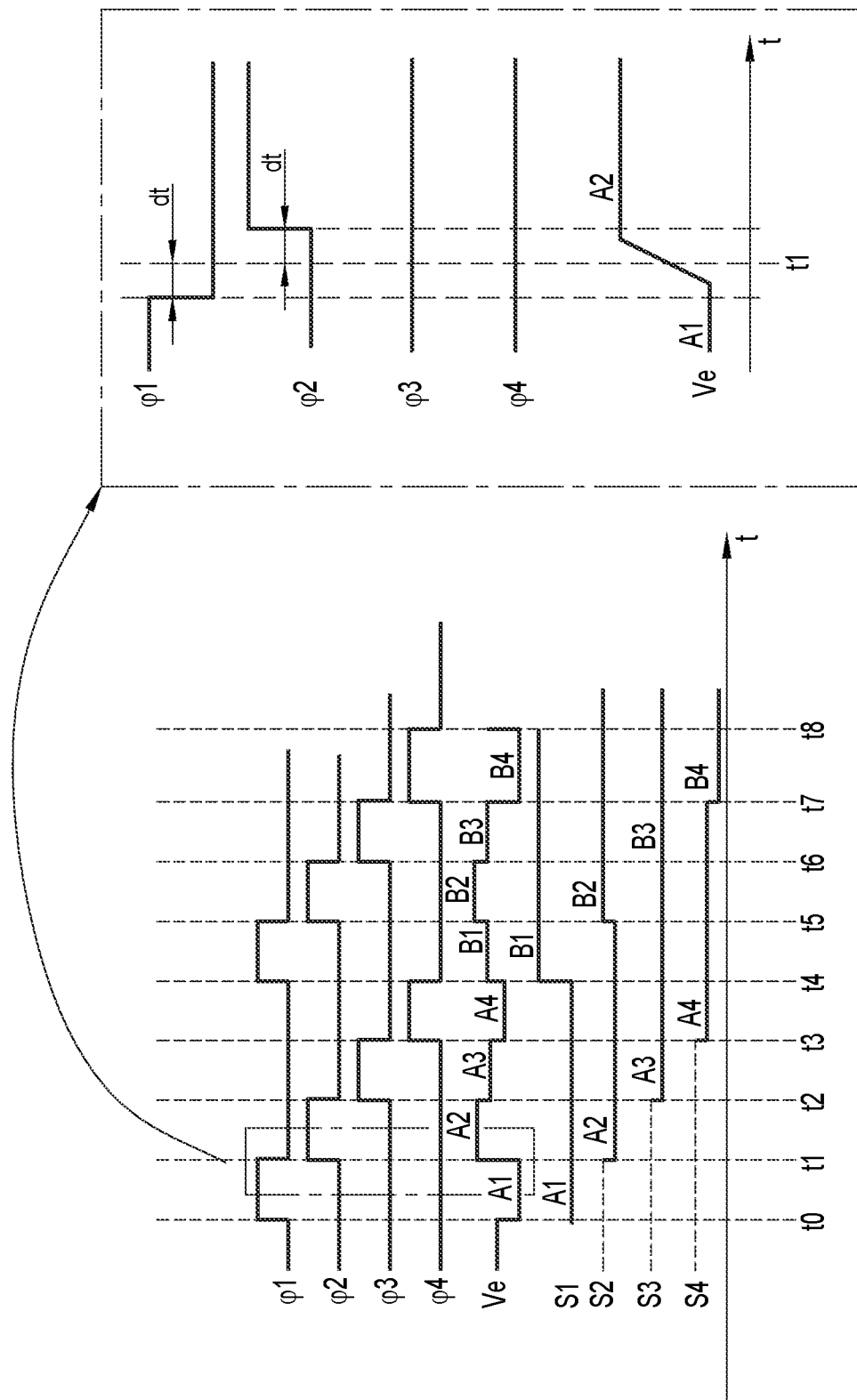
FIG. 2 is a timing diagram representing the time evolution of the different signals involved in the operation of the electronic circuit shown in FIG. 1.

FIG. 2 shows a possible time evolution of the different signals making possible the operation the circuit 100 shown in FIG. 1. For the clarity of the description, we are only presenting the operation for the four bias lines 11 to 14.

In the timing diagram of FIG. 2, the time t is represented on the abscissa.

The analog voltage Ve is sampled over a time step, e.g. of 3 ns. Ve successively takes the values A1 (between instants t0 and t1), A2 (between the instants t1 and t2), A3 (between the instants t2 and t3), A4 (between the instants t3 and t4), B1 (between the instants t4 and t5), B2 (between the instants t5 and t6), B3 (between the instants t6 and t7), B4 (between the instants t7 and t8), etc.

To store the value A1 in the first cell 110, the control signal φ1 is switched from level 0 to level 1 at the instant t0 and is maintained at the level 1 on the first sampling step until the instant t1.

As a result, the switch I1 is closed so that the capacitor C1 stores the level of potential A1. Hence, the signal S1, on the first line 11, connected to the cell 110, switches to the level of potential A1 at the instant t0.

The control signal φ1 is then switched from the level 1 to the level 0 at the instant t1 so that the switch I1 is open from said instant on. However, the signal S1 is maintained at the level of potential A1 by the capacitor C1 which has stored the level of potential A1 during the first sampling step.

The signal S1 is maintained at the level A1 over the following sampling steps, until another level of potential is stored by the first cell 110, e.g. at the fifth sampling step where the analog voltage Ve takes the value B1 and the control signal φ1 is such that same switches the switch I1 to closing.

At the instant t1, the analog voltage Ve switches from level A1 to level A2.

Similarly, in order to record the value A2 in the second cell 120, the signal φ2 switches from the level 0 to the level 1 over the second sampling step in order to close the switch I2 and charge the capacitor C2 to the level of potential A2. The signal S2 on the second line 12 is brought to the level A2 starting from the instant t1.

At the instant t2, the control signal φ2 switches from the level 1 to the level 0 leading to the opening of the switch I2. The level of potential A2 having been stored by the second cell 120, the signal S2 on the second line 12 is maintained at the level A2. Said bias value is maintained until another value is recorded in the second cell 120, such as e.g. at the sixth time step when the analog voltage takes the value B2.

The process is iterated: first on the third time step in order to record the value A3 of the analog signal Ve in the third memory cell 130 and to bring the signal S3 on the third bias line 13 to the level of the static potential A3; then, on the fourth time step, in order to record the level A4 of the analog voltage Ve in the fourth cell 140 and to bring the signal S4 on the line 14 to the level A4; etc.

In the embodiment shown in FIG. 2, the different control signals are cyclically switched to level 1, so that a memory cell stores one level of static potential per cycle. In the example shown in FIG. 2, a cycle consists of four successive sampling steps, since only the first four memory cells of the electronic circuit are concerned. Thereby, at the fifth sampling step (first step of the second cycle), a new value is stored in the first cell.

It can be seen, from the timing diagram shown FIG. 2, that the control signal generation unit 104 and the DAC 102 for generating the analog voltage Ve have to be synchronized, so that the current value of the voltage Ve that is desired to be recorded in a cell, coincides with the closing time of the switch of the cell and that the changes in the value of Ve occur when the control signals are in the level '0'.

As shown in the right-hand part of FIG. 2, a control signal, such as e.g. the signal φ1, is such that, following the storage of a value, the signal has to request the reopening of the switch I1 of the first memory cell 110 before the value of the voltage Ve is modified, in order to be certain that it is indeed the value A1 which is stored in the first cell. Similarly, the control signal, such as e.g. the signal φ2, is such that, in order to store a value, the signal has to request the closing of the switch I2 of the second memory cell 120 only when the value of the voltage Ve is established, in order to be certain that it is the value A2 which is stored in the second cell.

As a result, two control signals do not mutually overlap, so as to prevent the switch of the cell wherein a value has just been recorded, from remaining closed while the voltage Ve switches to the value that is desired to be recorded in the other cell. It can be said that the level '1' of the control signals is exclusive, while the level '0' is shared.

The interval 2dt around the instant of transition of the value of the voltage Ve is also used for taking into account the dynamic range of the DAC 102 and the slope required for switching from one value of the analog voltage Ve to the next.

Thereby, according to the invention, the level of static bias to which a bias line has to be brought at the current instant is stored in the memory cell associated with said line.

When it is desired to change the level of bias of the line, the closing of the switch of the cell should be requested, while applying an input voltage, the value of which is suitable for charging the capacitor and bringing the line to the desired level of bias, then to request the closing of the switch of the cell, in order to maintain the line at the desired level of bias just recorded.

It is thus necessary to iterate such steps in order to modify the level of bias of a bias line during the operation of the quantum circuit 10.

It should be noted that, compared with the prior art mentioned in the introduction of the present patent application, a switching matrix is dispensed with by directly connecting a bias line to a memory cell. Such direct connection is necessary for the capacitor of the memory cell to play the role thereof of attenuating the disturbances caused by the parasitic capacitor between neighboring lines.

However, the negative effects of a capacitive interference can be further attenuated by varying the phasing of the control signals, as will now be described in relation to the second and third embodiments.

Figure 3:
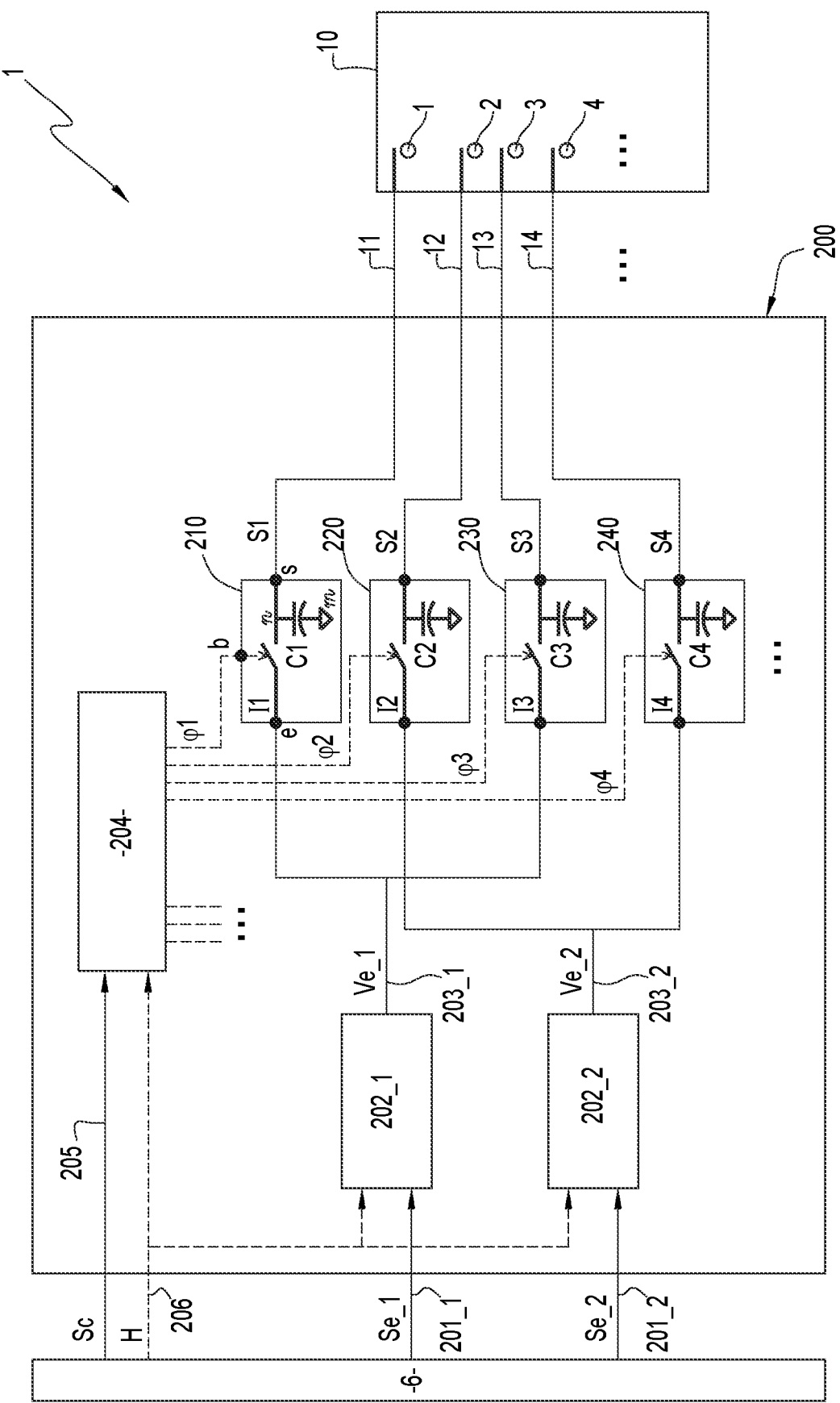
FIG. 3 is a schematic representation of a second embodiment of an interface electronic circuit for a quantum circuit.
Figure 4:
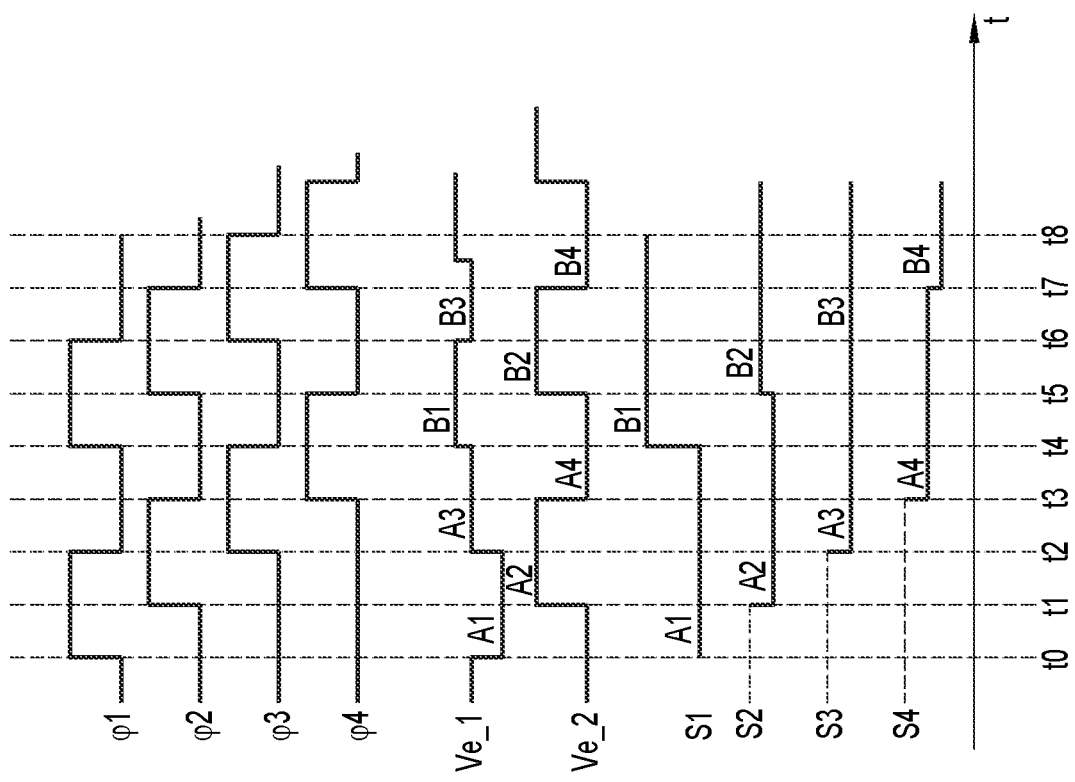
FIG. 4 is a timing diagram representing the time evolution of the different signals involved in the operation of the electronic circuit shown in FIG. 3.

FIGS. 3 and 4 illustrate a second embodiment of the circuit according to the invention.

A component of the circuit 200 of FIG. 3 which is identical or similar to a component of the circuit 100 of FIG. 1 is identified by a reference number increased by one hundred with respect to the reference number used in FIG. 1 for identifying the identical or similar component.

The circuit 200, controlled by a high-level electronic system 6, is intended for bringing the bias lines 11, 12, 13 and 14 of the quantum circuit 10 to desired potentials.

The circuit 200 includes a first DAC 202_1 apt to deliver, on an output line 203_1, a first analog voltage Ve_1, and a second DAC 202_2 apt to deliver, on an output line 203_2, a second analog voltage Ve_2.

The first DAC 202_1 is controlled by a digital static control signal Se_1 applied to an input 201_1 of the circuit 200 by the high-level electronic system 6 and the second DAC 202_2 is controlled by a digital static control signal Se_2 applied to an input 201_2 of the circuit 200 by the high-level electronic system 6.

Like for the first embodiment, the circuit 200 includes a plurality of memory cells, of which only the first four, 210, 220, 230, 240, respectively, are shown in FIG. 3. The structure of the cells is identical to the structure of the cells shown in FIG. 1.

The first memory cell 210 applies a bias signal S1 to the first line 11. The second memory cell 220 applies a bias signal S2 to the second line 12. The third memory cell 230 applies a bias signal S3 to the third line 13. Finally, the fourth memory cell 240 applies a bias signal S4 to the fourth line 14.

Each cell is controlled by a control signal delivered by the unit 204. Thereby, the first cell 210 is controlled by a first signal φ1, the second cell 220 is controlled by a second signal φ2, the third cell 230 is controlled by a signal φ3 and the fourth cell 240 is controlled by a signal φ4.

The control signal generation unit 204 is driven by an addressing signal Sc coming from the high-level electronic system 6 applied to an input 205 of the circuit 200.

Finally, the control signal generation unit 204 and the first and second DACs, 202_1 and 202_2, share a common clock signal H, supplied e.g. by the high-level electronic system 6 on a link 206.

In the second embodiment, the odd rank memory cells 2N+1 (N being an integer greater than or equal to zero), such as the first and third cells 210 and 230, are connected in parallel at the output of the first DAC 202_1. The analog voltage Ve_1 is thus applied to the input of the odd cells.

On the other hand, the even rank memory cells 2N+2, such as the second and fourth cells 220 and 240, are connected in parallel at the output of the second DAC 202_2. The analog voltage Ve_2 is thus applied to the even cells.

It should be noted that a bias line coming from an even memory cell, such as the line 12 coming from the cell 220, has, as neighboring lines, lines coming from odd cells, in the present case the lines 11 and 13 coming from the memory cells 210 and 230, respectively. Conversely, an odd line has two even lines as neighbors.

Referring to the timing diagram shown in FIG. 4, the analog voltage Ve_1 generated by a DAC, 202_1 or Ve_2 generated by DAC 202_2, changes value every two sampling steps.

During a cycle allowing the four memory cells to be successively addressed, the first analog voltage Ve_1 allows the level of bias to be recorded only in the odd cells, 210 and 230, whereas the second analog voltage Ve_2 allows the level of bias to be stored only in the even cells, 220 and 230.

Thereby, e.g., the first analog voltage Ve_1 takes the value A1 over the first and second sampling steps (between the instants t0 and t2) and the value A3 over the third and fourth sampling steps (between the instants t2 and t4), whereas the second analog voltage Ve_2 takes the value A2 over the second and third sampling steps (between the instants t1 and t3) and the value A4 over the fourth and fifth sampling steps (between the instants t3 and t5).

There is thus a lag of one sampling step between the edges of change of value of the analog voltages at the output of the two DACs.

In the second embodiment, the control signal φ1 is placed at the level '1' during not only the first sampling step, but also the second sampling step, in order to record the value A1 of the voltage Ve_1 in the cell 210. The line 11 is then brought to the level of potential A1 from the instant t0 on and is maintained at said value until the instant t4 (when a new value B1 will be stored in the first cell 210).

Similarly, the control signal φ2 is placed at the level '1' during not only the second sampling step, but also the third sampling step, in order to record the value A2 of the voltage Ve_2 in the cell 220. The line 12 is then brought to the level of potential A2 from the instant t1 on and is maintained at said value until the instant t5 (when a new value B2 will be stored in the second cell 220).

By maintaining the control signal φ1 at the level 1 beyond the instant t1, i.e. beyond the instant of modification of the level of potential on the line 12 neighboring the line 11, the level of potential on the line 11 is maintained strictly at the level A1. Indeed, the switch I1 remaining closed at the instant t1, the current value of the analog voltage Ve_1 applied to the input of the first cell 210 constrains the potential of the line 11 to the level A1.

Thereby, when the level A2 is recorded in the second cell 220, the corresponding variation of the signal S2 does not interfere with the level A1 that has just been recorded in the first cell 210 in order to define the level of bias of the line 11.

Therefore, the variation in potential of a neighboring line does not modify the level of potential wherein a line has just been placed.

Such result is obtained by multiplying (in a limited way so as not to increase the number of links between the different temperature domains) the number of DACs and by ensuring that the end of the control signal is used to record a level of potential in a cell, partially overlaps the start of the control signal for recording a level of potential in a neighbor cell.

Obviously, such partial overlap between the control signals of neighboring cells is found between the signals φ2 and φ3, between the signals φ3 and φ4, etc.

Figure 5:
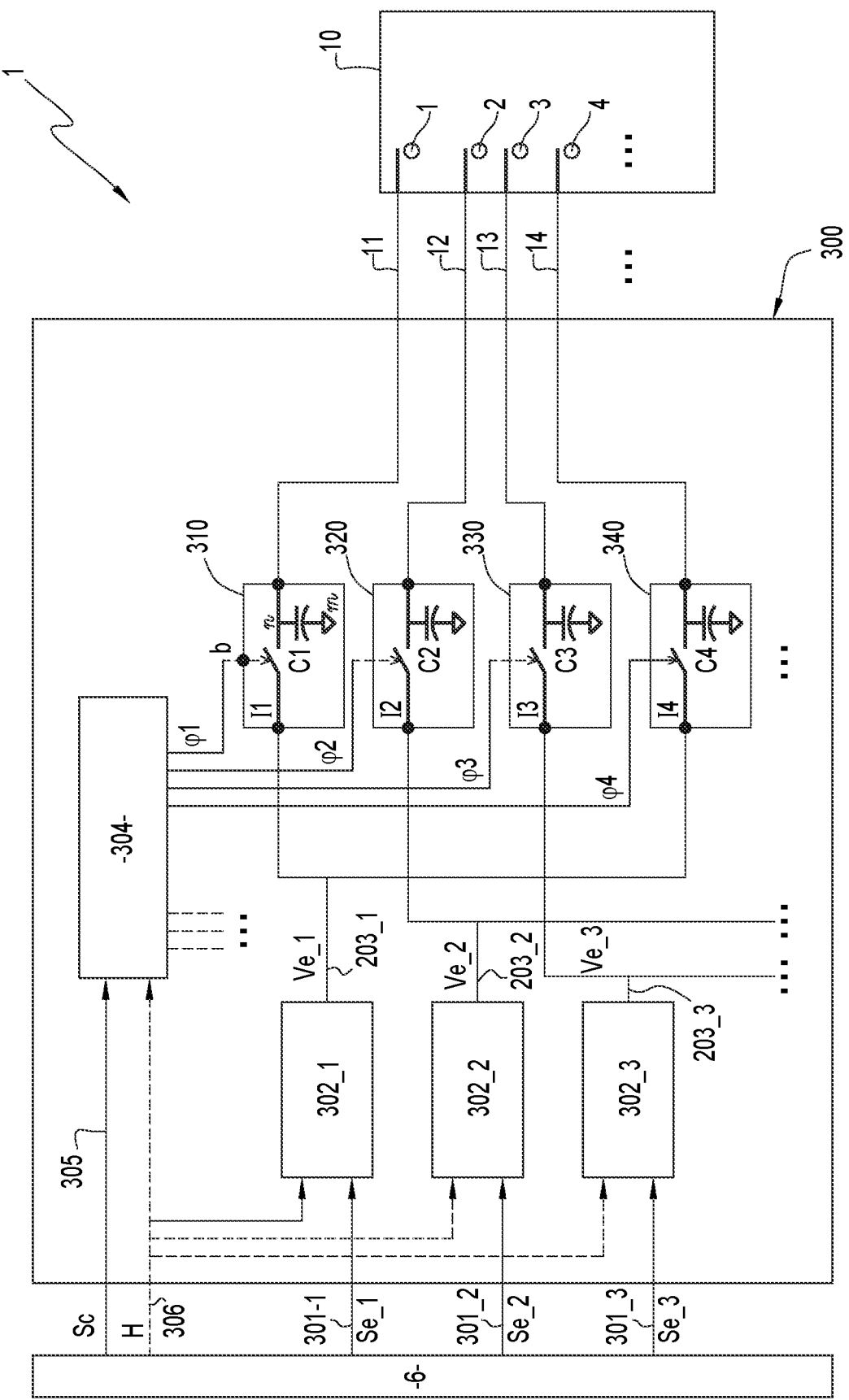
FIG. 5 is a schematic representation of a third embodiment of an interface electronic circuit for a quantum circuit.
Figure 6:
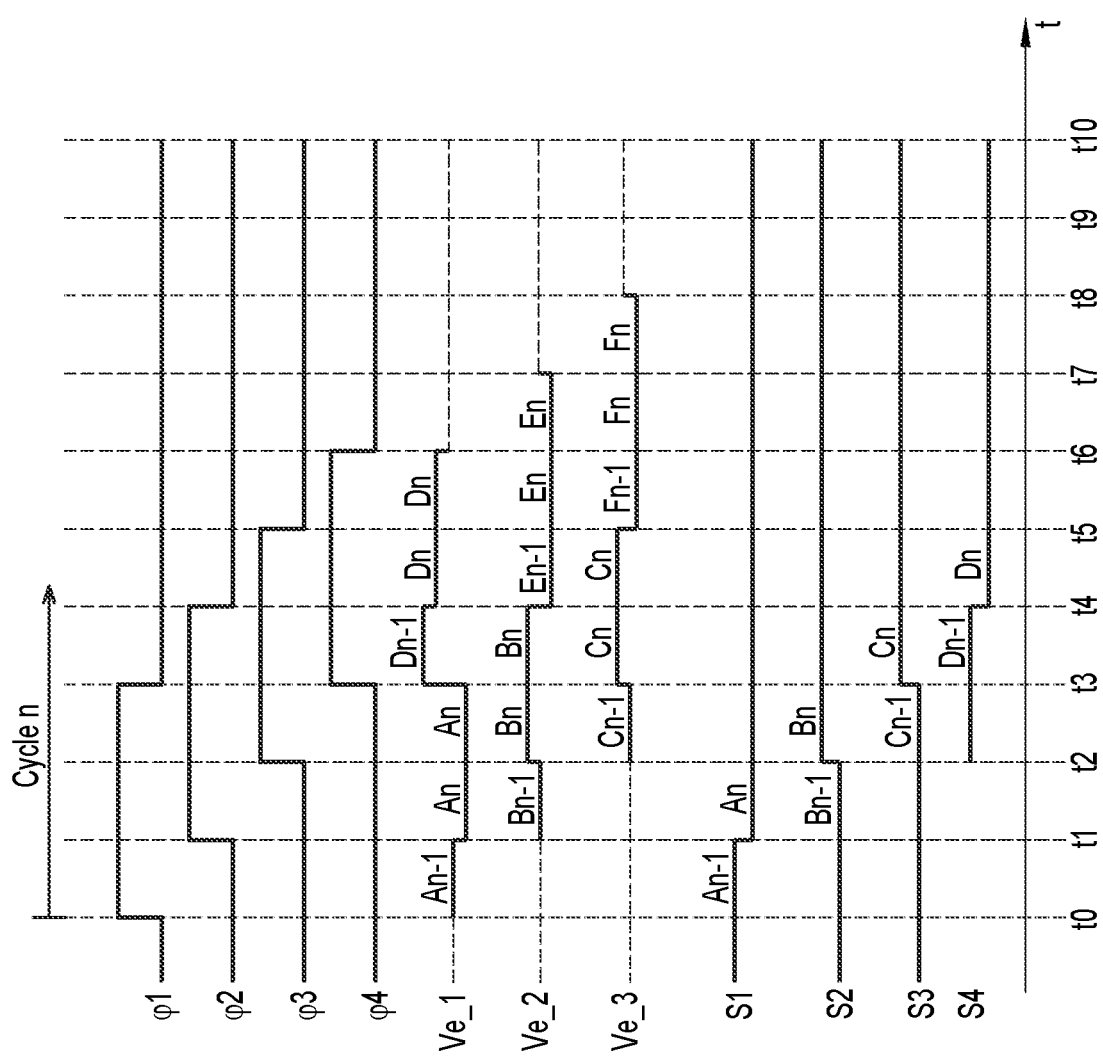
FIG. 6 is a timing diagram representing the time evolution of the different signals involved in the operation of the electronic circuit shown in FIG. 5.

FIGS. 5 and 6 relate to a third embodiment of the circuit according to the invention.

A component of the circuit 300 shown in FIG. 5 which is identical or similar to a component of the circuit 100 shown in FIG. 1 is identified by a reference number increased by two hundred with respect to the reference number used in FIG. 1 for identifying the identical or similar component.

The circuit 300 is intended for defining the levels of potentials to which are brought the bias lines 11, 12, 13 and 14 associated with the qubits of the quantum circuit 10.

The circuit 300, which is controlled by a high-level electronic system 6, includes a first DAC 302_1 (driven by a digital control signal Se_1 applied to an input 301_1 of the circuit 300 by the high-level electronic system 6), a second DAC 302_2 (driven by a digital control signal Se_2 applied to an input 301_2 of the circuit 300 by the high-level electronic system 6) and a third DAC 302_3 (driven by a digital control signal Se_3 applied to an input 301_3 of the circuit 300 by the high-level electronic system 6).

At the output of the first DAC 302_1, the analog voltage Ve_1 is applied to the memory cells of rank 3N+1 (where N is an integer), like the memory cells 310 and 340.

At the output of the second DAC 302_2, the analog voltage Ve_2 is applied to the memory cells 3N+2, like the cell 320.

Finally, at the output of the third DAC 302_3, the analog voltage Ve_3 is applied to the memory cells of range 3N+3, like the memory cell 330.

Each of the memory cells has a structure identical to the structure of the cell 110 of the first embodiment shown in FIG. 1.

Each of the cells is controlled by a control signal generated by the unit 304 from an addressing signal Sc applied to an input 305 of the circuit 300 by the high-level electronic system 6.

The unit 304 and the three DACs are synchronized by a common clock signal H applied e.g. to the input 306 of the circuit 300.

FIG. 6 is a timing diagram of the signals involved in the operation of the circuit 300 for a cyclic programming of the signals on the bias lines.

The programming of the signal Si on the row of rank i during the nth cycle includes three successive phases: a recall of the potential stored in the previous cycle whereas the potential on one of the two neighboring lines is modified; the storage of a new potential and the maintenance of the new potential whereas the potential on the other of the two neighboring lines is modified.

For example, if we follow more particularly the operation of the second cell 320 during the cycle n.

The control signal φ2 is switched from the level 0 to the level 1 between the instants t1 and t4, i.e. over three sampling steps.

The analog voltage Ve_2, applied between the second cell 320, is developed so as to take the value Bn−1 between the instants t1 and t2, and the value Bn between the instants t2 to t4. The value Bn−1 is the value which has been stored by the second cell 320 during the preceding cycle, n−1, and Bn is the value which is desired to be stored in the second cell 320 during the current cycle, n, then to be maintained in the second cell.

The fact that the control signal φ2 is at the level 1 between the instants t1 and t2, i.e. when the value of the voltage Ve_2 is equal to Bn−1, makes it possible to force the potential of the second line 12 to take the value Bn−1. The potential to which the line 12 is brought from the previous cycle is thus not altered by the modification of the potential on the neighboring line 11 at the instant t1 (the signal S1 switching from the value An−1 to the value An).

The fact that the control signal φ2 is at the level 1 between the instants t2 and t3, i.e. when the value of the voltage Ve_2 switches from Bn−1 to Bn, enables the new value to be stored in the second cell 320 and the potential of the second row 12 to be brought to the value Bn.

The fact that the control signal φ2 is at the level 1 between the instants t3 and t4, i.e. when the value of the voltage Ve_2 is maintained at Bn, makes it possible to force the potential of the second line 12 to take the value Bn. The potential to which the line 12 is brought from the instant t2 on is thus not altered by the modification of the potential on the neighboring line 13 at the instant t3 (the signal S3 switching from the value Cn−1 to the value Cn).

During the cycle n, a similar description could be made for recording and maintaining the potential An in the first cell, the potential Cn in the third cell, the potential Dn in the fourth cell, the potential En in the fifth cell, the potential Fn in the sixth cell, etc.

It is found that in such approach, the control signal of a cell takes the level '1' during a time interval covering the changes of potential over the two neighboring lines, not only to allow the line coming from said cell to be brought to a new level of potential, but also to maintain the level of potential of said line, whereas the potentials on the two neighboring lines are modified.

Figure 7:
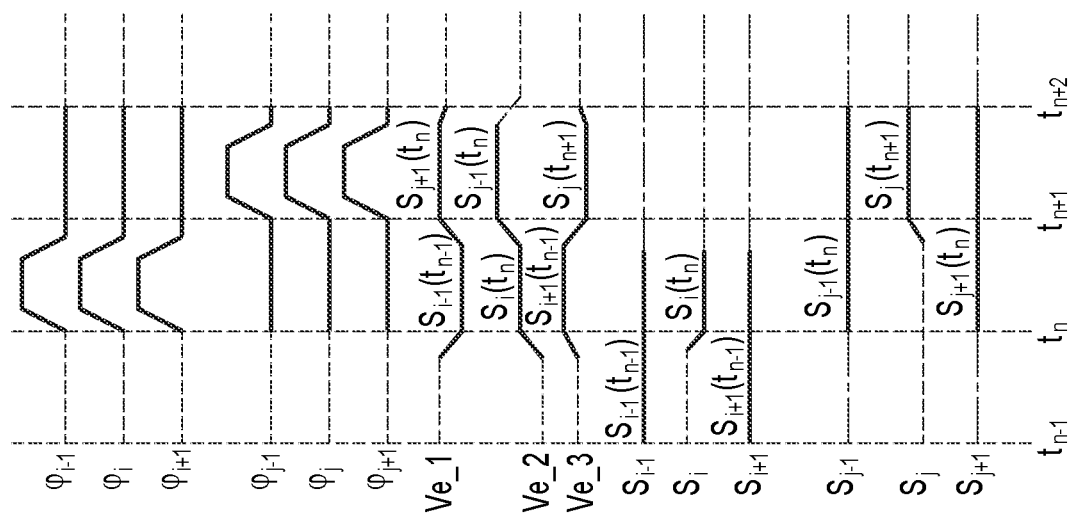
FIG. 7 is a timing diagram generalizing the principle of the protection of a bias line against a modification of the potential of a neighboring bias line.

Such approach can be generalized to non-cyclic programming. The above is shown in FIG. 7.

A bias line of rank i circulates between two neighboring bias lines of rank i−1 and i+1, respectively.

A bias line of rank j circulates between two neighboring bias lines of rank j−1 and j+1, respectively.

For such a topology, three DACs are thus needed for delivering a first analog voltage Ve_1, a second analog voltage Ve_2 and a third analog voltage Ve_3, respectively.

Without any loss of generality, it is considered that i is equal to 2 modulo 3, i.e. that the values of the signal Si on the row of rank i are given by the second voltage Ve_2. As a result, the values of the signal Si−1 on the neighboring row of rank i−1 are given by the first voltage Ve_1 and the values of the signal Si+1 on the neighbor row of rank I+1 are given by the third voltage Ve_3.

Assuming that the row of rank j−1 is not neighboring the row of rank i, i.e. that at least two lines separate the rows of rank i and j.

If, at the instant tn, it is desired to bring the row of rank i to the potential Si (tn), it is appropriate that, at the instant tn, the control signals φi−1, φi and φi+1 switch over the cells associated with the rows of rank i−1 into the on state, i and i+1 and that the values of the analog voltages at said instant are:
  for the first voltage Ve_1 (applied to the line i−1), equal to Si−1 (tn−1), i.e. the value previously stored for the line i−1, in order to maintain the potential of the neighboring line;
  for the second voltage Ve_2 (applied to the line i), equal to Si (tn), i.e. the value to be stored on line i; and,
  for the first voltage Ve_3 (applied to the line i+1), equal to Si+1 (tn−1), i.e. the value previously stored for the line i+1, in order to maintain the potential of the neighboring line during the modification of the potential on the line i.

At the next time step tn+1, a similar description could be made in order to show how to protect the lines j−1 and j+1 neighboring the line j the potential of which is desired to be modified. In FIG. 7, it is considered e.g. that j is equal to 0 modulo 3, i.e. the values of the signal Sj on row j are given by the third voltage Ve_3 and the values of the signal Sj−1 on the row j−1 are given by the second voltage Ve_2 and the values of signal Sj+1 on the row j+1 are given by the first voltage Ve_1.

If now there is a collision such that e.g. the line i+1 is also the line j−1, in order to protect the line i+1 both from a modification of the potential on the line i at the instant tn and from a modification of the potential on the line j at the instant tn+1, it suffices to maintain the control signal φi+1 at the level 1 over the steps tn and tn+1 and to apply an analog voltage at the input of the cell i+1 equal to Si+1 (tn−1) in order to force and thus maintain the potential on the line Ii+1.

Such mechanism for maintaining the potentials on the neighboring bias lines makes it possible to guarantee, at any time during operation, a precision of less than 100 μV on the potential of a line.

It should be noted that the use of three DACs is conditioned by the topology of the quantum circuit. Indeed, in the embodiment presented, the bias lines are routed at a single level, so that a line has two neighboring lines. It is thus necessary to have three DACs in order to control the potential of each of the lines of said group of lines. In a variant, with a routing over a plurality of levels, a line can have K neighboring lines, e.g. six in a hexagonal topology. In such case, it can be advantageous to use K+1 DACs.

Figure 8:
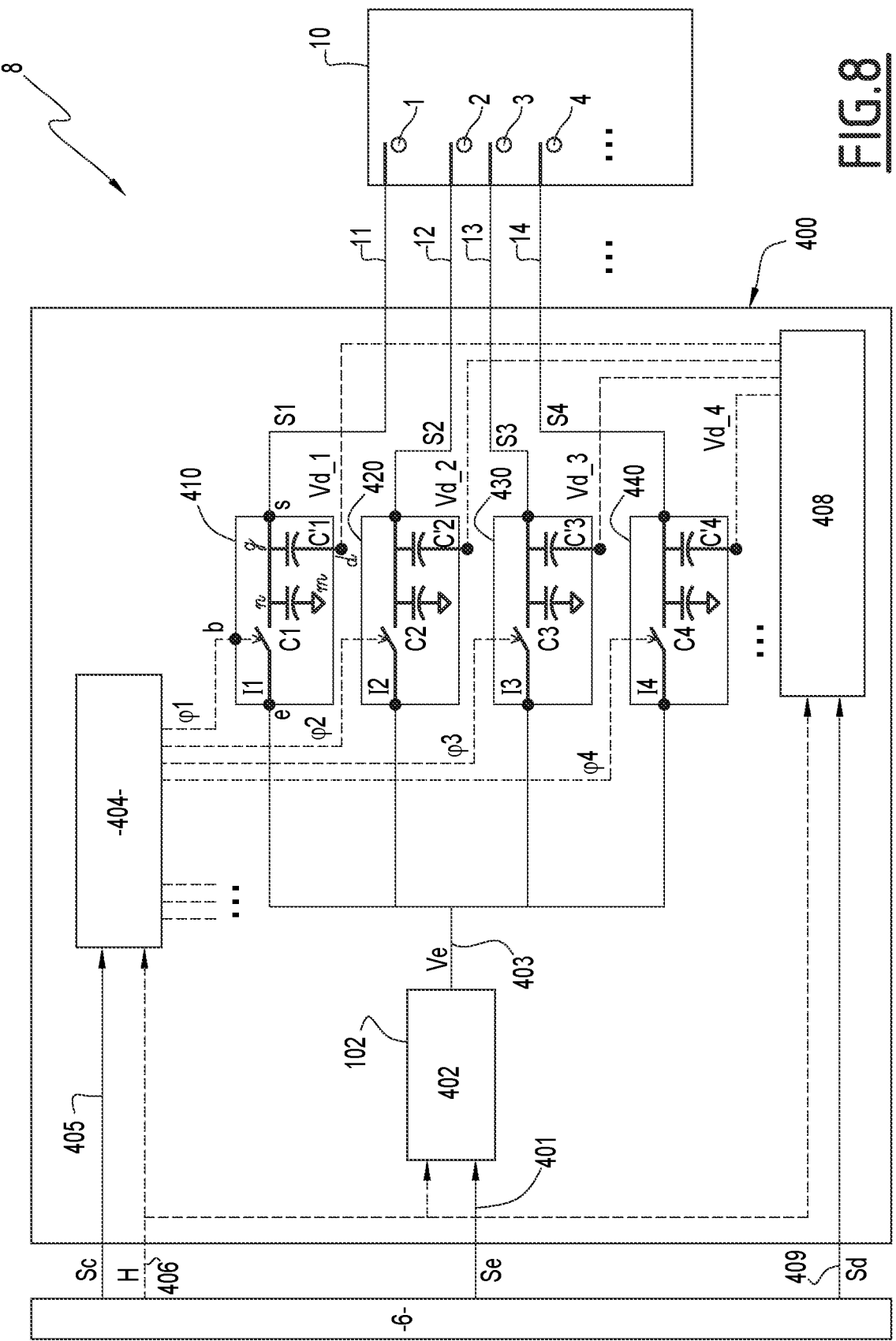
FIG. 8 is a schematic representation of a variant of embodiment of one or the other of the embodiments of FIGS. 1 to 6 making possible, in addition, the application of dynamic biases on the bias lines of the quantum circuit; and, FIG. 9 is a timing diagram representing the time evolution of the signals of the circuit shown in FIG. 8 for the application of dynamic biases.
Figure 9:
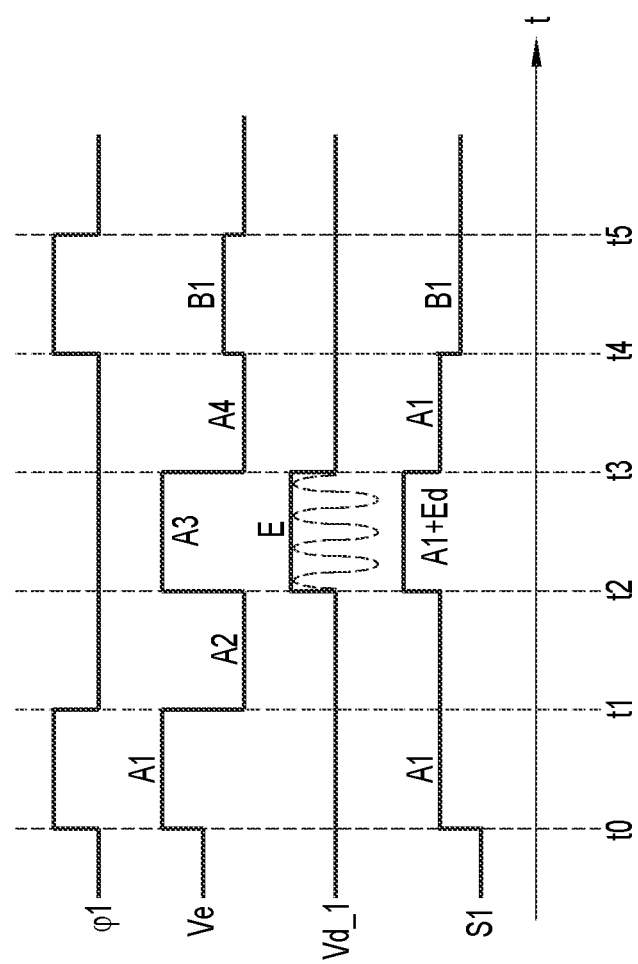

FIGS. 8 and 9 show a particularly advantageous variant of embodiment, presented for the first embodiment, but which can be applied to one or other of the preceding embodiments.

Such variant of embodiment makes it possible to apply a dynamic bias to one or other of the bias lines.

Indeed, beyond the need to bring a bias line to a static potential in order to shape the quantum well of the corresponding qubit, it is also advantageous to be able to apply, via the same bias line, a dynamic bias. The application of a dynamic bias of determined frequency can be used, e.g., for the identification of the frequency signatures of the qubits read by the same reading device, the modification of the configuration of a plurality of qubits in parallel, or the activation and coupling of spins between close qubits. Document FR 2 012 968 describes the application of such a dynamic bias on the side of the quantum circuit to be driven.

A component of the circuit 400 of FIG. 8, which is identical or similar to a component of the circuit 100 of FIG. 1, is identified by a reference number increased by three hundred with respect to the reference number used in FIG. 1 for identifying the identical or similar component.

The circuit 400 includes a single DAC 402 connected at the output thereof to four memory cells 410, 420, 430 and 440.

The structure of the cells is modified with respect to the structure of the cells of the embodiments shown in FIGS. 1, 3 and 5.

In the example of the cell 410, in addition to the switch I1 which is connected between input e and intermediate node n and which is commanded to open or close by a control signal φ1 applied to a terminal b, and a "static" capacitor C1 which is connected between the intermediate node n and the reference node m, the memory cell includes a second "dynamic" capacitor C'1 connected in parallel with the static capacitor C1, between an intermediate node g and a supply terminal d of the memory cell. The output s of the cell (to which the bias line 11 is connected) is connected directly to the node g (or to the node n).

In such variant of embodiment, the power supply node d of each of the cells is connected to a unit 408 for generating an alternating analog voltage: Vd_1 for the first cell 410, Vd_2 for the second cell 420, Vd_3 for the third cell 430, and Vd_4 for the fourth cell 440.

The unit 409 is driven by a dynamic digital control signal Sd applied by the high-level electronic system to an input link 409 of the circuit 400.

As illustrated in FIG. 9, for the operation of the first cell 410, the level of static potential A1 was recorded in the cell 410 by placing the control signal q1 at the level 1 between the instants t0 and t1.

Once the control signal q1 was brought back to the level 0, the signal S1 is maintained at the level A1 by the static capacitor C1.

Between the instants t2 and t3, the alternating analog voltage Vd_1 of amplitude E and frequency F is applied by the unit 408 to the terminal d of the cell 410.

Via the dynamic capacitor C'1, the variation of potential at terminal d generates a variation of potential at node g, i.e. a modification of the signal S1.

Thereby, a dynamic bias Ed is superimposed on the static bias A1 in the signal S1.

Preferentially, the amplitude E of the alternating analog voltage Vd_1 is much lower than the amplitude of the static analog voltage Ve. In any case, on a bias line, the dynamic bias, Ed, remains at a low amplitude level (generally of a few 100 µV) compared to the static bias, A1, (generally of a few mV).

Thereby, the addition of a unit 408 in order to generate dynamic stimuli, makes a full operation of the quantum circuit 10 possible.

It is the direct connection of the bias line at the output of a memory cell that makes possible the injection of a dynamic bias, by adding a "dynamic" capacitor in the memory cell.

It should be noted that the embodiments shown in FIGS. 1 and 8 e.g. could be mixed, some of the memory cells having a structure enabling only a static signal to be applied and a small number of memory cells enabling a dynamic signal to be applied in addition to the static signal.

In a variant, there can also be a decorrelation between the sequencing of the static and dynamic biases.

In a variant, it is possible to extend the number of DACs, i.e. the number of inputs of the circuit beyond three. The control signals will advantageously be suitable for neutralizing the interference between neighboring lines during a change of level of bias on the lines. The above could depend on the specific topology retained for routing the bias lines of the quantum circuit 10.

The advantage of the circuit according to the invention is also to make a partitioning of the components possible between the different temperatures domains 300 K, 4 K, 100 mK, while maintaining a reduced number of connections between the 4 K range and the 100 mK range. Thereby, the DAC or DACs of the circuit according to the invention, which are active components, can be placed in the ambient or intermediate temperature domain, whereas the control signal generation unit and the different memory cells can be placed as close as possible to the quantum circuit, in the cryogenic temperature domain.

In a variant, the control signals are generated in the 4K domain and the decoding thereof is performed in the 100 mK domain.

It should be noted that the more the number of DACs increases, the more the speed of the DACs can be reduced, but the more the number of inputs of the circuit increases and hence of bridges between different temperature domains.

In a variant, a memory cell could have another structure. For example, a memory cell could comprise a second switch/capacitor unit in series with a first switch/capacitor unit, each unit conforming to the structure of a cell shown in FIG. 1.

Such a variant makes it possible to improve the performance in terms of isolation between the input and the output of the memory cell by the presence of the two switches in series.

The control signal of the second switch has to be correctly synchronized with the control signal of the first switch.

The or each switch of a memory cell can e.g. be made by an N-type MOS transistor. Advantageously, instead of using a bulk MOS transistor, a reverse back gate MOS transistor will be used, which increases the insulation in the 'off' state while decreasing the resistance of the switch in the 'on' state. It is also possible to combine the N and P types in order to increase the operating dynamics of the or each switch.

In the present description, the format of the signals applied by the high-level electronic system to the electronic control circuit of the quantum circuit has not been specified since said format can be chosen without any particular requirements from among the different formats known to a person skilled in the art. More particularly, if the number of links between high-level electronic system and electronic circuits is considered too large, the number of links can be reduced by providing for the serialization of the different signals on only one link or a smaller number of links. The electronic circuit then includes a de-serialization interface in order to separate each signal and to address the signal to a particular component.

The invention claimed is:

1. An electronic circuit for driving a quantum circuit, intended for being positioned at an interface between a high-level electronic system and the quantum circuit, the electronic circuit being connected to the quantum circuit by a plurality of bias lines, each bias line of the plurality of bias lines being brought to a control potential of a configuration of a qubit of the quantum circuit, the electronic circuit including:

at least one digital-to-analog converter—DAC delivering an analog voltage from a static digital control signal supplied by the high-level electronic system;

a plurality of memory cells, connected in parallel at the output of the at least one DAC, each memory cell of the plurality of memory cells comprising, between an input and an intermediate node, a controlled switch, and, between the intermediate node and a reference node brought at a reference potential, a static capacitor, an output of the memory cell being connected to the intermediate node, the static capacitor being capable to store a level of static potential at which to maintain the bias line of the plurality of bias lines connected at the output of the memory cell; and, a means of generating control signals for generating, in synchronization with the at least one DAC, from an addressing signal supplied by the high-level electronic system, a control signal for each memory cell, the control signal being capable of switching over the controlled switch of the memory cell between an off state and an on state, a value of the static capacitor of a memory cell being selected in order to make negligible a parasitic capacitor affecting a distal section of the bias line connected to the memory cell and which circulates parallel to a distal section of an adjacent bias line, wherein, for a current memory cell of the plurality of memory cells, the control signal switches over the controlled switch of the current memory cell to the on state whereas a current value of the analog voltage applied to the input of the current memory cell is equal either to a level of potential to be stored in the current memory cell, or a level of potential already stored in the current memory cell and to be maintained in the current memory cell while a modification is made on the level of potential stored in a neighbor memory cell, the neighboring memory cell being a memory cell of the plurality of memory cells to which is connected a line neighboring the bias line connected to the current memory cell.

2. The electronic circuit according to claim 1, wherein the bias line connected to the memory cell has a proximal section with a routing capacitator, the value of the static capacitor being selected to take into account the routing capacitor of the proximal section of the bias line.

3. The electronic circuit according to claim 1, wherein the distal section of the bias line connected to the memory cell has a length between 10 and 100 µm, the value of the static capacitor being selected between 10 and 1000 fF.

4. The electronic circuit according to claim 1, wherein at least one memory cell of the plurality of memory cells further includes a so-called dynamic capacitor, connected between the intermediate node and a power supply terminal, in parallel with the static capacitor, the electronic circuit including a unit for generating an alternating analog voltage controlled by a dynamic digital control signal supplied by the high-level electronic system and suitable for applying the alternating analog voltage to the supply terminal in order to bring the bias line connected to the output of the at least one memory cell to a dynamic potential.

5. The electronic circuit according to claim 1, wherein the control signal generating unit and the at least one DAC are synchronized by a common clock signal.

6. The electronic circuit according to claim 1, wherein the at least one DAC is positioned in an ambient temperature domain or in an intermediate temperature domain, wherein the plurality of memory cells are positioned in a cryogenic temperature domain, and wherein the control signal generation unit is either fully positioned in the cryogenic temperature range or distributed between the cryogenic temperature range and one of the ambient temperature range or the intermediate temperature range.

7. The electronic circuit according to claim 1, wherein the at least one DAC is a first DAC and the plurality of memory cells is a first plurality of memory cells, the electronic circuit includes a second plurality of memory cells and a second DAC, a second memory cell of the second plurality of memory cells being connected to an output of the second DAC, a second bias line coupled to the second memory cell being positioned between a first bias line coupled to a first memory cell of the first plurality of memory cells and a third bias line coupled to a third memory cell of the first plurality of memory cells.

8. The electronic circuit according to claim 1, wherein the at least one DAC is a first DAC and the plurality of memory cells being a first plurality of memory cells connected to the first DAC, the electronic circuit includes a second DAC and a second plurality of memory cells connected to the second DAC, and, wherein the electronic circuit further includes a third DAC and a third plurality of memory cells connected to the third DAC, a second bias line connected to a second memory cell of the second plurality of memory cells having, as neighboring bias lines, a first bias line connected to a first memory cell of the first plurality of memory cells and a third bias line connected to a third memory cell of the third plurality of memory cells.

9. The electronic circuit according to claim 1, wherein the quantum circuit comprises a set of spin qubits to which said bias lines are connected.

10. A quantum computer including a high-level electronic system, an electronic circuit and a quantum circuit, the electronic circuit being at an interface between the high-level electronic system and the quantum circuit for driving the quantum circuit, wherein the electronic circuit is an electronic circuit according to claim 1.

* * * * *